United States Patent
Kim et al.

(10) Patent No.: US 8,049,553 B2
(45) Date of Patent: Nov. 1, 2011

(54) HIGH-VOLTAGE CMOS CHARGE PUMP

(75) Inventors: Sung-Eun Kim, Seoul (KR); Jin-Kyung Kim, Daejon (KR); Chang-Hee Hyoung, Daejon (KR); Sung-Weon Kang, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/741,362

(22) PCT Filed: May 21, 2008

(86) PCT No.: PCT/KR2008/002820
§ 371 (c)(1),
(2), (4) Date: May 4, 2010

(87) PCT Pub. No.: WO2009/061049
PCT Pub. Date: May 14, 2009

(65) Prior Publication Data
US 2010/0244935 A1    Sep. 30, 2010

(30) Foreign Application Priority Data
Nov. 5, 2007  (KR) .................. 10-2007-0112212

(51) Int. Cl.
*G05F 1/10* (2006.01)
(52) U.S. Cl. .......................... 327/536; 363/60
(58) Field of Classification Search .......... 327/536; 363/59–60
See application file for complete search history.

(56) References Cited

U.S. PATENT DOCUMENTS

| | | | | |
|---|---|---|---|---|
| 5,436,587 | A * | 7/1995 | Cernea | 327/536 |
| 5,508,971 | A * | 4/1996 | Cernea et al. | 365/185.23 |
| 5,748,032 | A * | 5/1998 | Baek | 327/536 |
| 5,943,226 | A * | 8/1999 | Kim | 363/60 |
| 6,107,863 | A * | 8/2000 | Iwata | 327/536 |
| 6,525,949 | B1 * | 2/2003 | Johnson et al. | 363/60 |
| 6,545,529 | B2 * | 4/2003 | Kim | 327/536 |
| 6,922,096 | B2 * | 7/2005 | Cernea | 327/536 |
| 7,256,641 | B2 * | 8/2007 | Namekawa et al. | 327/536 |

(Continued)

FOREIGN PATENT DOCUMENTS
KR    1020020078971 A    10/2002
(Continued)

OTHER PUBLICATIONS
International Search Report for PCT/KR2008/002820 filed May 21, 2008.
(Continued)

*Primary Examiner* — Thomas J Hiltunen

(57) ABSTRACT

Provided is a high-voltage complementary metal-oxide semiconductor (CMOS) charge pump. The high-voltage CMOS charge pump includes a first Dickson charge pump for doubling a supply voltage based on an input clock signal and a complementary input clock signal with reversed phases to each other; a level shifter for doubling voltage levels of the input clock signal and the complementary input clock signal based on an output signal and a complementary output signal of the first Dickson charge pump as power sources, to thereby output a doubled-output clock signal and a doubled-output clock signal; and a second Dickson charge pump for doubling voltage levels of the output signal and the complementary output signal based on the doubled-output clock signal and the doubled-complementary output clock signal from the level shifter.

8 Claims, 6 Drawing Sheets

U.S. PATENT DOCUMENTS

| | | | |
|---|---|---|---|
| 7,259,612 B2 * | 8/2007 | Saether | 327/536 |
| 7,282,987 B2 * | 10/2007 | Lee et al. | 327/536 |
| 7,439,795 B2 * | 10/2008 | Yanagigawa et al. | 327/536 |
| 7,576,523 B2 * | 8/2009 | Ogawa et al. | 323/274 |
| 7,656,221 B2 * | 2/2010 | Maejima | 327/534 |
| 7,772,914 B2 * | 8/2010 | Jung | 327/390 |
| 2004/0164766 A1 | 8/2004 | Yu | |
| 2005/0258810 A1 | 11/2005 | Lin | |
| 2006/0049866 A1 * | 3/2006 | Namekawa et al. | 327/536 |
| 2007/0053227 A1 * | 3/2007 | Ragone et al. | 365/189.09 |
| 2007/0096796 A1 | 5/2007 | Firmansyah et al. | |

FOREIGN PATENT DOCUMENTS

KR      1020070019234 A      2/2007

OTHER PUBLICATIONS

Written Opinion of the International Searching Authority for PCT/KR2008/002820 filed May 21, 2008.

* cited by examiner

[Fig. 1] (Prior Art)
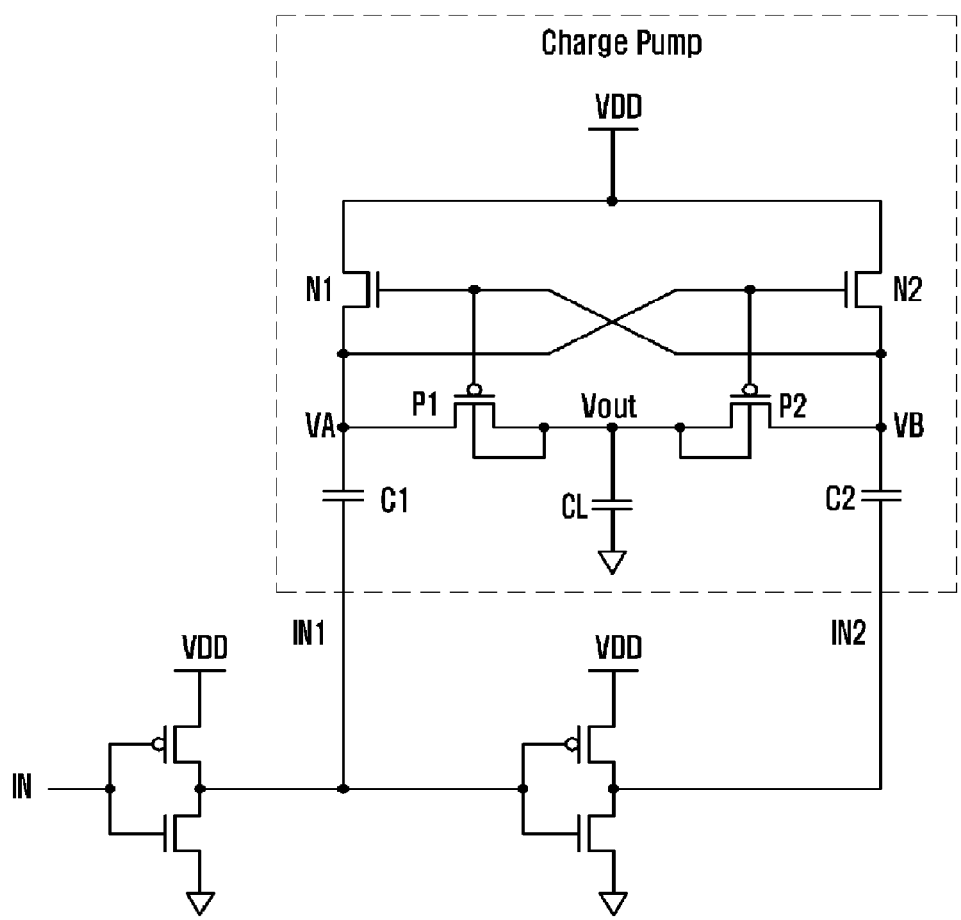

[Fig. 2] (Prior Art)
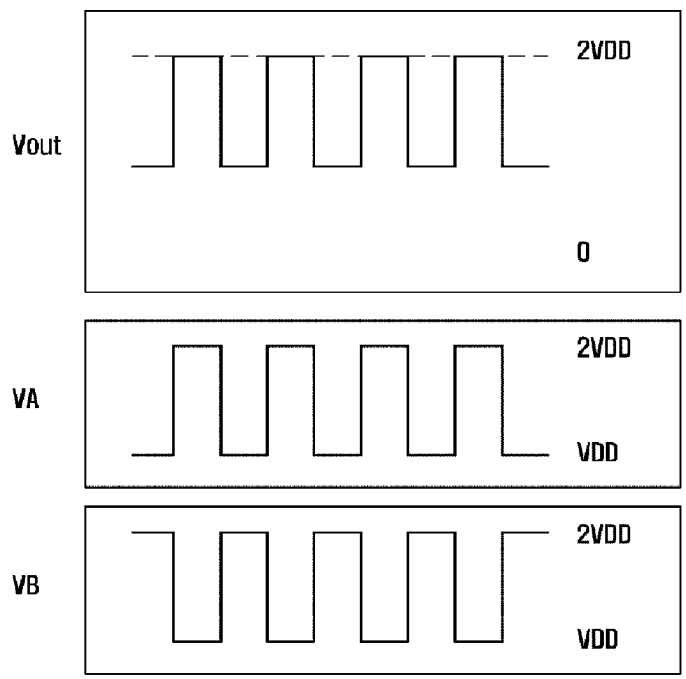
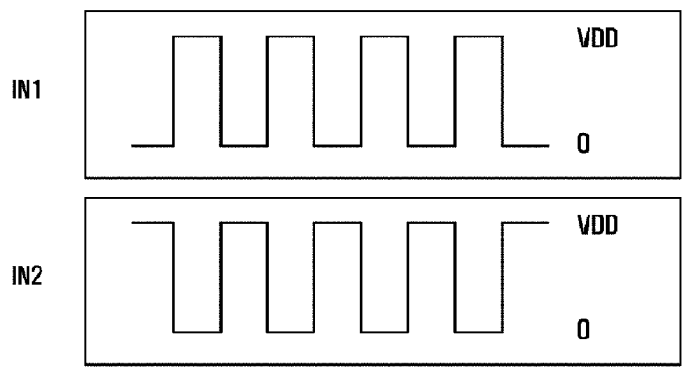
[Fig. 3] (Prior Art)
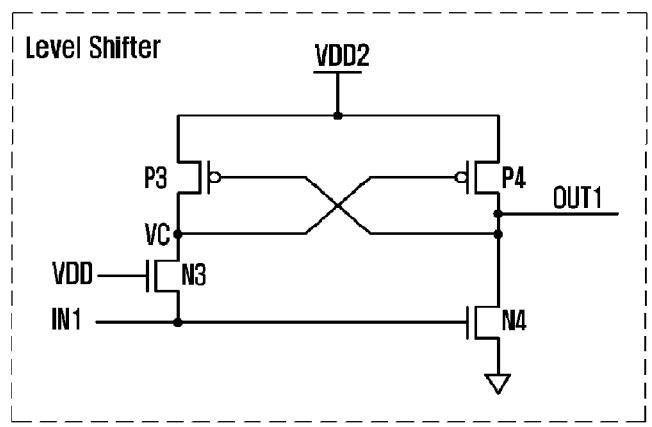

[Fig. 4] (Prior Art)
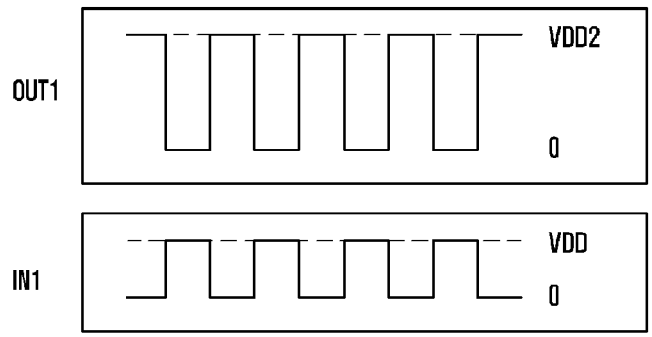
[Fig. 5] (Prior Art)
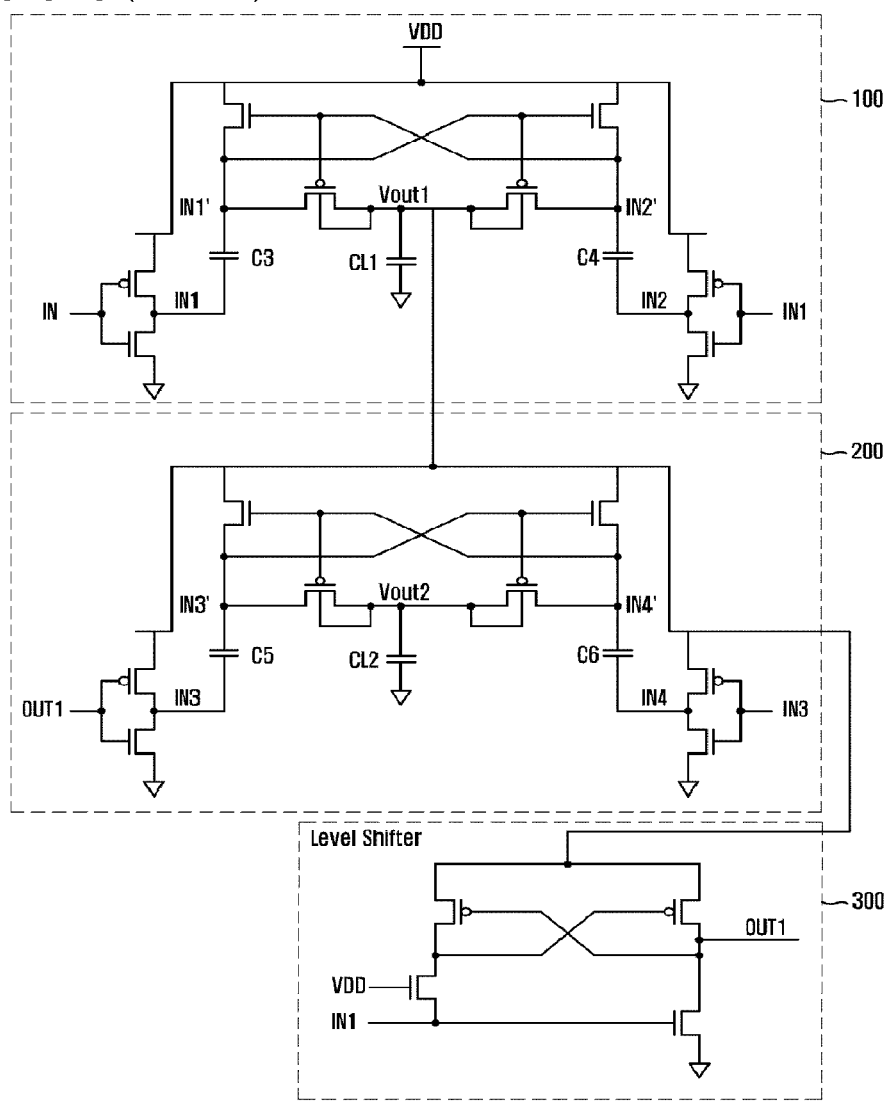

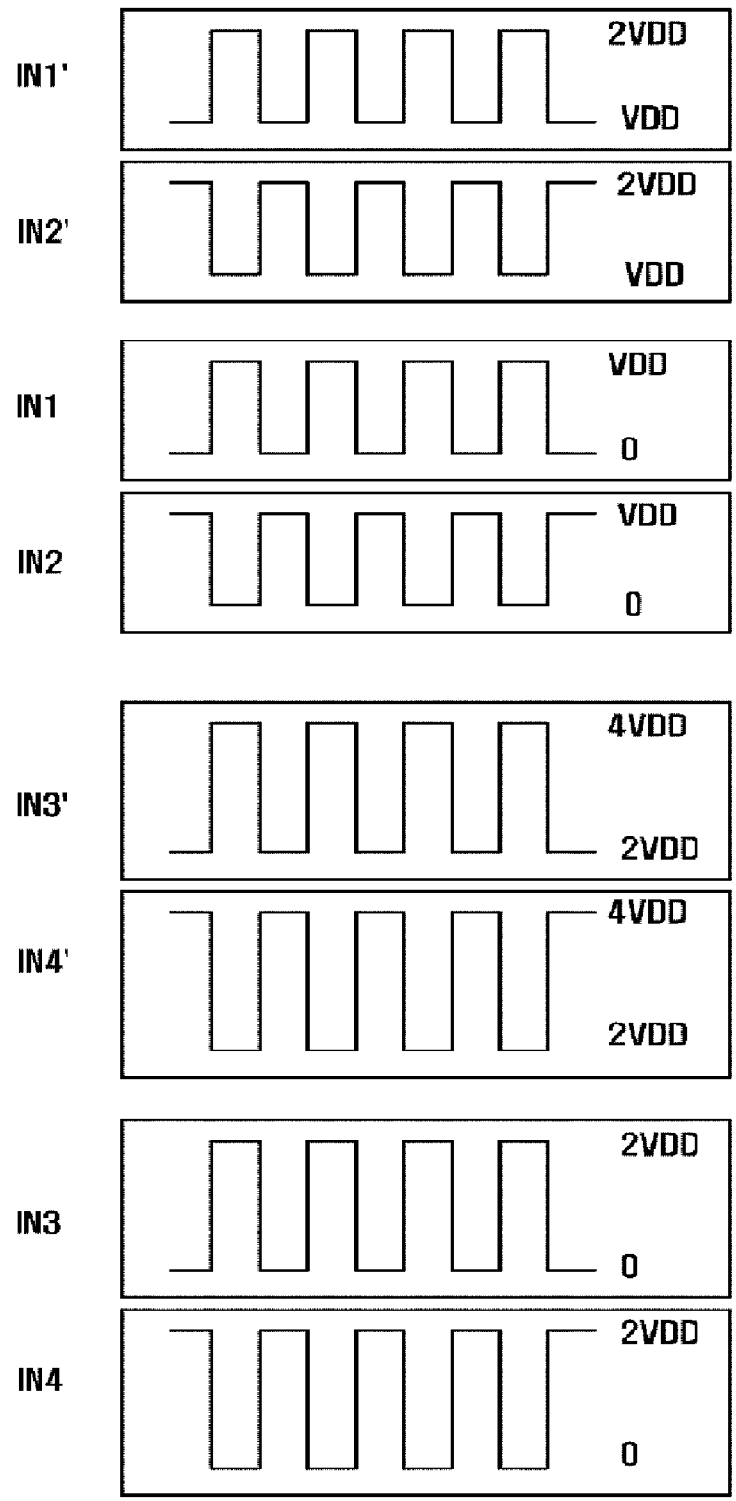
[Fig. 6] (Prior Art)

[Fig. 7]
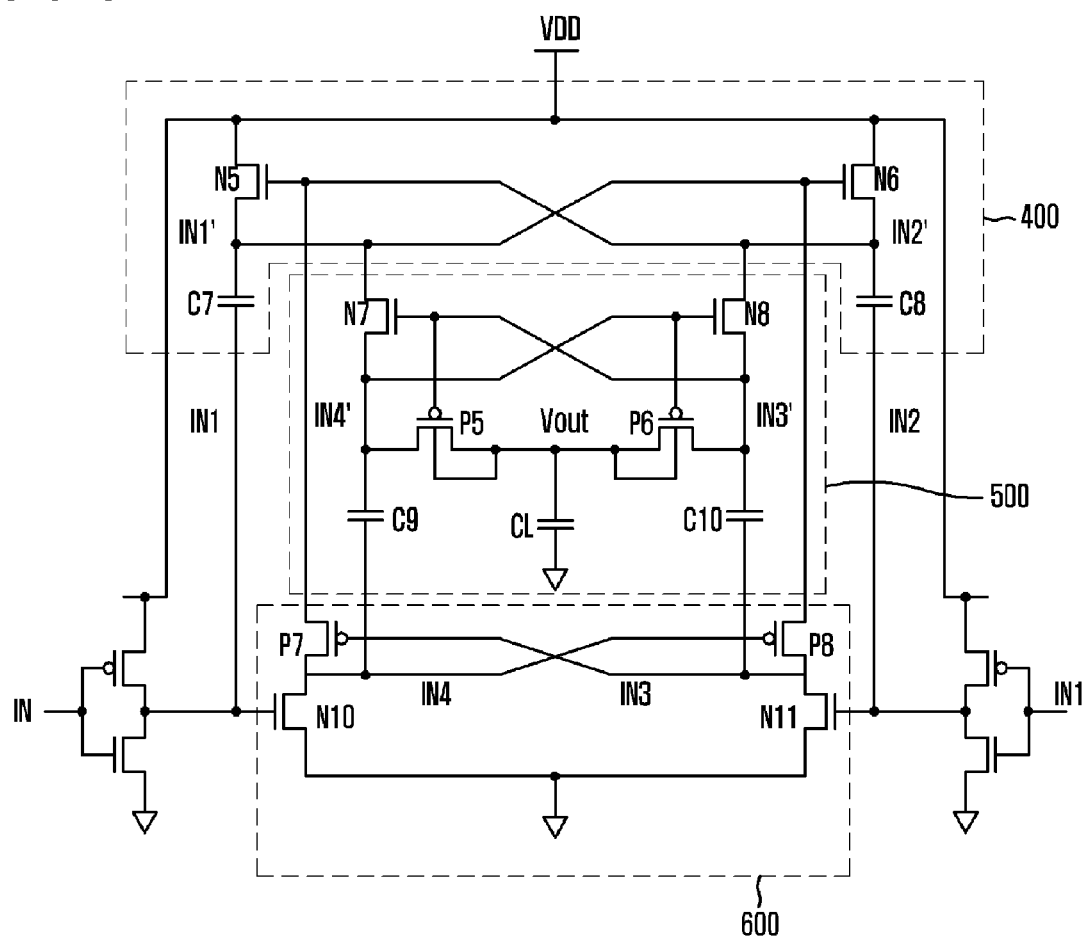

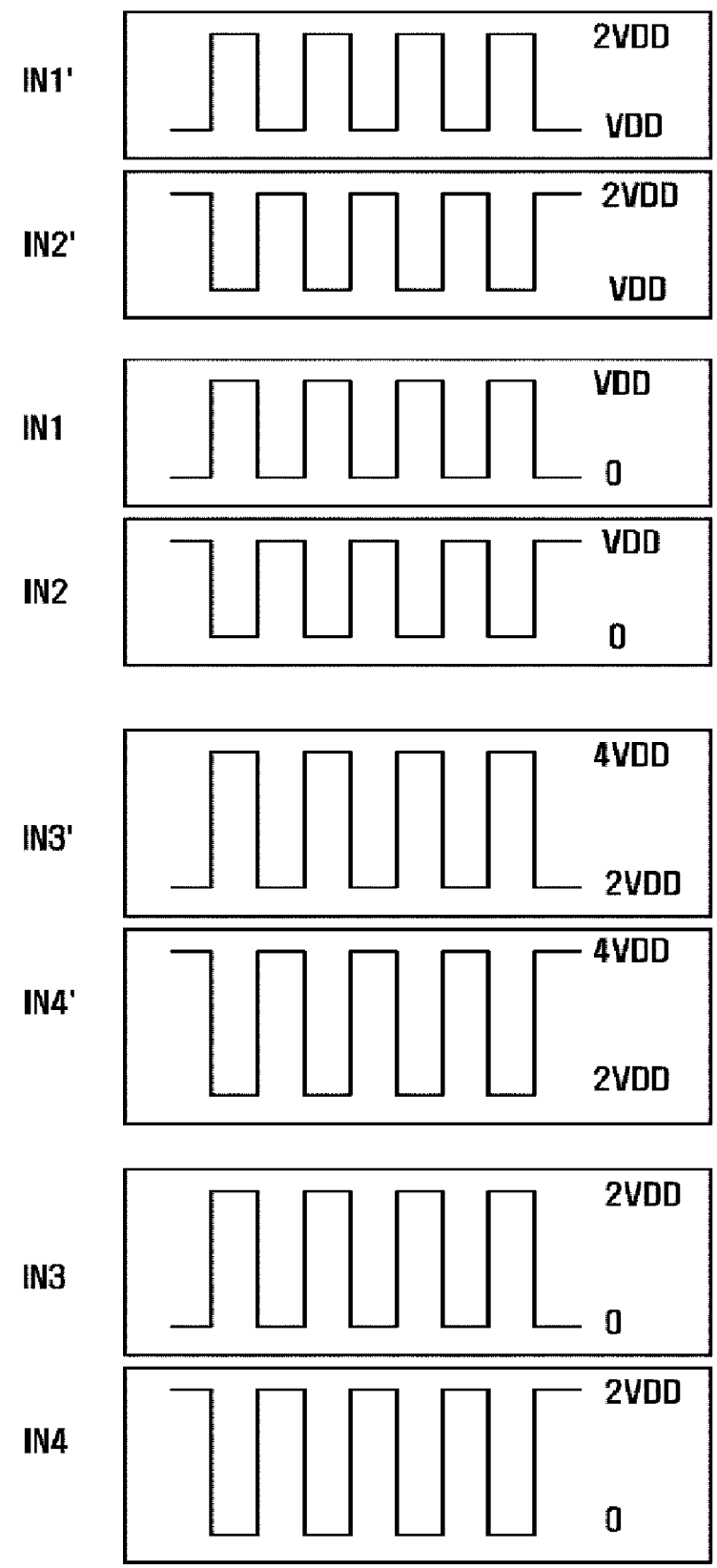
[Fig. 8]

HIGH-VOLTAGE CMOS CHARGE PUMP

TECHNICAL FIELD

The present invention relates to a charge pump; and, more particularly, to a high-voltage, e.g., 4VDD, complementary metal-oxide semiconductor (CMOS) charge pump.

This work was supported by the Information Technology (IT) research and development program of the Korean Ministry of Information and Communication (MIC) and the Korean Institute for Information Technology Advancement (IITA) [2005-S-069-02, "Development of Wearable System Using Physiological Signal Processing"].

BACKGROUND ART

Generally, a charge pump is used to generate an internal voltage, e.g., 2VDD or 4VDD, which is higher than a supply voltage VDD. A Dickson charge pump is widely used as the charge pump.

FIG. 1 is a circuit diagram of a general Dickson charge pump.

As shown in FIG. 1, a first input clock signal IN1 and a second input clock signal IN2 are inputted through inverters, and the first and second input clock signals IN1 and IN2 swing with swing amplitude of VDD. The first input clock signal IN1 is out of phase with the second input clock signal IN2. That is, the second input clock signal IN2 is generated by inverting the first input clock signal IN1.

The Dickson charge pump includes a first NMOS transistor N1, a second NMOS transistor N2, a first PMOS transistor P1, a second PMOS transistor P2, a first flying capacitor C1, and a second flying capacitor C2.

In the first NMOS transistor N1, a drain is coupled to the supply voltage VDD, a source is connected to a node VA, and a gate is connected to a node VB. In the second NMOS transistor N2, a drain is coupled to the supply voltage VDD, a source is connected to the node VB, and a gate is connected to the node VA.

In the first PMOS transistor P1, a source is connected to the node VA, a drain is connected to an output voltage terminal Vout, and a gate is connected to the node VB. In the second PMOS transistor P2, a source is connected to the node VB, a drain is connected to the output voltage terminal Vout, and a gate is connected to the node VA.

The first flying capacitor C1 is connected between the node VA and a first clock input terminal IN1. The second flying capacitor C2 is connected between the node VB and a second input clock terminal IN2.

A load capacitor CL connected between the output voltage terminal Vout and a ground terminal GND. The load capacitor CL is formed by modeling a load capacitance.

FIG. 2 is a diagram showing waveforms at each node of the Dickson charge pump shown in FIG. 1. Hereinafter, operations of the Dickson charge pump will be described referring to FIG. 2.

When a voltage level of a node IN1 is VDD and a voltage level of a node IN2 is GND, a voltage level of the node VA is raised to 2VDD due to a bootstrapping phenomenon. Then, the second NMOS transistor N2 is turn-on, charges the second flying capacitor C2, and thus a voltage level of the node VB becomes VDD. Then, the second PMOS transistor P2 and the first NMOS transistor N1 are turn-off due to the node VB having the VDD, the first PMOS transistor P1 is turn-on and a voltage level of the node VA becomes 2VDD. Consequently, the load capacitor CL connected to the output voltage terminal Vout is charged with 2VDD.

When a voltage level of the node IN1 is GND and a voltage level of the node IN2 is VDD, the voltage level of the node VB having VDD is raised to 2VDD due to the bootstrapping phenomenon. Then, the first NMOS transistor N1 is turn-on, charges the first flying capacitor C1, and thus a voltage level of the node VA becomes VDD. Then, the first PMOS transistor P1 and the second NMOS transistor N2 are turn-off due to the node VA having the VDD level, the second PMOS transistor P2 is turn-on and a voltage level of the node VB becomes 2VDD. Consequently, the load capacitor CL connected to the output voltage terminal Vout is charged with 2VDD.

In other words, when the voltage level of the node VA is 2VDD, the first NMOS transistor N1 is turn-off, the first PMOS transistor P1 is turn-on, the output voltage terminal Vout becomes 2VDD and the node VB is charged with VDD. When the voltage level of the node VB is 2VDD, the second NMOS transistor N2 is turn-off, the second PMOS transistor P2 is turn on, the output voltage terminal Vout becomes 2VDD and the node VA is charged with VDD. Voltage levels of the node VA and the node VB are alternatively raised to 2VDD, the raised voltage charges the load capacitor CL and the output voltage is constantly 2VDD.

The Dickson charge pump is a basic charge pump. The Dickson charge pump generates 2VDD output voltage from the supply voltage VDD by receiving the out-of phase clock signals without a separated controller.

FIG. 3 is a circuit diagram of a general level shifter.

As shown in FIG. 3, the level shifter is a circuit for transforming swing amplitude of the clock signal. The level shifter transforms the first input clock signal IN1 having VDD swing amplitude into a third input clock signal IN3 having 2VDD swing amplitude, and outputs the third input clock signal to a output terminal OUT1.

The level shifter includes a third PMOS transistor P3, a fourth PMOS transistor P4, a third NMOS transistor N3 and a fourth NMOS transistor N4.

In the third PMOS transistor P3, a source is coupled to a second supply voltage VDD2, a drain is connected to a node VC, and a gate is connected to the first output terminal OUT1. In the fourth PMOS transistor P4, a source is coupled to the second supply voltage VDD2, a drain is connected to the first output terminal OUT1, and a gate is connected to the node VC.

In the third NMOS transistor N3, a source is connected to the first clock input terminal IN1, a drain is connected to the node VC, and a gate is coupled to the supply voltage VDD. In the fourth NMOS transistor N4, a source is connected to the GND, a drain is connected to the first output terminal OUT1, and a gate is connected to the first clock input terminal IN1.

FIG. 4 is a diagram showing waveforms at each node of the level shifter shown in FIG. 3. Hereinafter, operations of the level shifter will be described referring to FIG. 4.

When a voltage level of the first input clock signal IN1 is VDD, the fourth NMOS transistor N4 is turn-on and a voltage level of the first output terminal OUT1 is GND. Then, the third PMOS transistor P3 becomes turn-on and the fourth PMOS transistor P4 becomes turn-off due to cross-coupled structure.

On the other hand, when the voltage level of the first input clock signal IN1 is GND, the fourth NMOS transistor N4 is turn-off, the third NMOS transistor N3 becomes turn-on and the fourth PMOS transistor P4 becomes turn-on. Then, when the fourth PMOS transistor P4 is turn-on, third PMOS transistor P3 is turn-off, the third PMOS transistor P3 prevents current flows through the third NMOS transistor N3, and the first output terminal OUT1 becomes VDD2 due to the cross-coupled structure.

As described above, while the first input clock signal swings between VDD and GND, the first output terminal OUT1 swings between GND and the second supply voltage VDD2 in the level shifter.

FIG. 5 is a circuit diagram of a cascade charge pump receiving the supply voltage VDD and generating 4VDD, which is quadruple of the supply voltage. The cascade charge pump is formed by cascading the Dickson charge pump and the level shifter.

As shown in FIG. 5, the cascade charge pump is formed by connecting two Dickson charge pumps 100 and 200 by using the level shifter 300. The Dickson charge pump is called as a cross-coupled doubler.

Structure of each Dickson charge pump 100 and 200 is the same as that of Dickson charge pump shown in FIG. 1, and the detailed description will be omitted.

FIG. 6 is a diagram showing waveforms at each node of the cascade charge pump shown in FIG. 5. Hereinafter, operations of the cascade charge pump will be described referring to FIG. 6.

The cascade charge pump includes a first Dickson charge pump 100, a second Dickson charge pump 200 and the level shifter 300.

The first Dickson charge pump 100 is the same as the Dickson charge pump shown in FIG. 1. That is, the first Dickson charge pump 100 receives input clock signals IN1 and IN2 which are out-of phase for each other and swing between GND and VDD, and generates IN1' and IN2' swing between VDD and 2VDD by using flying capacitors C3 and C4. A voltage level of the first output terminal Vout1 is raised to 2VDD by repeatedly outputting IN1' and IN2' having 2VDD.

An output voltage of the first Dickson charge pump 100 is used as a power source of the second Dickson charge pump 200 and the level shifter 300. The level shifter 300 receives the output voltage 2VDD of the first Dickson charge pump 100 and the first input clock signal IN1, generates a signal OUT1 having 2VDD swing amplitude, and outputs the signal OUT1 to the second Dickson charge pump 200. The signal OUT1 is inputted to the second Dickson charge pump 200 as a third input clock signal IN3 and a fourth input clock signal IN4 through inverters.

Accordingly, the second Dickson charge pump 200 uses output voltage 2VDD of the first Dickson charge pump 100 as the power source and receives the signal OUT1 having 2VDD swing amplitude from the level shifter 300 as an input signal. Then, the second Dickson charge pump 200 generates a signal IN3' and a signal IN4' swing between 2VDD and 4VDD by using flying capacitors C5 and C6. Herein, a voltage level of a second output terminal Vout2 is raised to 4VDD by repeatedly outputting IN3' and IN4' having 4VDD.

As described above, the conventional high-voltage CMOS charge pump requires two charge pumps, one level shifter, and four inverters in order to raise the supply voltage VDD up to the quadruple 4VDD of the supply voltage. Therefore, a large layout area is needed to implement the conventional high-voltage CMOS charge pump having a lot of MOS transistors.

DISCLOSURE OF INVENTION

Technical Problem

An embodiment of the present invention is directed to providing a high-voltage complementary metal-oxide semi-conductor (CMOS) charge pump which can reduce a circuit size.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a high-voltage complementary metal-oxide semi-conductor (CMOS) charge pump, including: a first Dickson charge pump for doubling a supply voltage based on an input clock signal and a complementary input clock signal with reversed phases to each other; a level shifter for doubling voltage levels of the input clock signal and the complementary input clock signal based on an output signal and a complementary output signal of the first Dickson charge pump as power sources, to thereby output a doubled-output clock signal and a doubled-complementary output clock signal; and a second Dickson charge pump for doubling voltage levels of the output signal and the complementary output signal based on the doubled-output clock signal and the doubled-complementary output clock signal from the level shifter.

In the conventional charge pump, n Dick charge pumps are cascaded, and an input clock signal of the subsequent Dickson charge pump is generated by inserting a level shifter between the Dickson charge pumps.

However, in the present invention, circuits of cascaded charge pump and a level shifter are combined, and unnecessary or redundant transistors are eliminated, and thus the number of MOS transistor is reduced.

ADVANTAGEOUS EFFECTS

As described above, the present invention can reduce circuit size by minimizing the number of MOS transistors of a high-voltage complementary metal-oxide semi-conductor (CMOS) charge pump.

BRIEF DESCRIPTION OF THE DRAWINGS

FIG. 1 is a circuit diagram of a general Dickson charge pump.

FIG. 2 is a diagram showing waveforms at each node of the Dickson charge pump shown in FIG. 1.

FIG. 3 is a circuit diagram of a general level shifter.

FIG. 4 is a diagram showing waveforms at each node of the level shifter shown in of FIG. 3.

FIG. 5 is a circuit diagram of a cascade charge pump, which is formed by cascading the Dickson charge pumps and the level shifter, receiving the supply voltage VDD and generating the quadruple 4VDD of the supply voltage.

FIG. 6 is a diagram showing waveforms at each node of the cascade charge pump shown in FIG. 5.

FIG. 7 is a circuit diagram illustrating a high-voltage CMOS charge pump in accordance with an embodiment of the present invention.

FIG. 8 a diagram showing waveforms of at each node of the high-voltage CMOS charge pump shown in FIG. 7.

BEST MODE FOR CARRYING OUT THE INVENTION

The advantages, features and aspects of the invention will become apparent from the following description of the embodiments with reference to the accompanying drawings, which is set forth hereinafter.

FIG. 7 is a circuit diagram illustrating a high-voltage CMOS charge pump in accordance with an embodiment of the present invention.

As shown in FIG. 7, the CMOS charge pump of the present invention includes a first Dickson charge pump 400, a level shifter 600, and a second Dickson charge pump 500.

The first Dickson charge pump 400 receives an input clock signal IN1 and a complementary input clock signal IN2, which are out-of phase each other, doubles the supply voltage VDD and output doubled-VDD.

The level shifter 600 uses a voltage of a node IN1' and a voltage of a node IN2' of the first Dickson charge pump 400 as power sources and doubles the voltage levels of the input clock signal IN1 and the complementary input clock signal IN2, to thereby output a doubled-output clock signal IN3 and a doubled-complementary output clock signal IN4.

The second Dickson charge pump 500 receives the doubled-output clock signal IN3 and the doubled-complementary output clock signal IN4 from the level shifter 600, doubles the voltage levels of the node IN1' and the node IN2'.

In addition, the CMOS charge pump of the present invention further includes a first CMOS inverter for receiving a clock signal IN and inverting the clock signal IN into the input clock signal IN1; and a second CMOS inverter for receiving the input clock signal IN1 and inverting the input clock signal IN1 into the complementary input clock signal IN2.

The first CMOS inverter includes a NMOS transistor, whose gate is connected to the node IN, source is connected to the GND, and drain is connected to a clock input node IN1, and a PMOS transistor, whose gate is gate is connected to the node IN, source is coupled to the supply voltage VDD, and drain is connected to the clock input node IN1.

The second CMOS inverter includes a NMOS transistor, whose gate is connected to the clock input node IN1, source is connected to the GND, and drain is connected to a complementary clock input node IN2, and a PMOS transistor, whose gate is connected to the clock input node IN1, source is coupled to the supply voltage VDD, and drain is connected to the complementary clock input node IN2.

The first Dickson charge pump 400 includes a fifth NMOS transistor N5, a sixth NMOS transistor N6, a seventh flying capacitor C7, and an eighth flying capacitor C8.

In the fifth NMOS transistor N5, a drain is coupled to the supply voltage VDD, a source is connected to the node IN1', and a gate is connected to the node IN2'. In the sixth NMOS transistor N6, a drain is coupled to the supply voltage VDD, a source is connected to the node IN2', and a gate is connected to the node IN1'.

The seventh flying capacitor C7 is connected between the node IN1' and the clock input node IN1. The eighth flying capacitor C8 is connected between the node IN2' and the complement clock input node IN2.

The level shifter 600 includes a seventh PMOS transistor P7, an eighth PMOS transistor P8, a tenth NMOS transistor N10 and an eleventh NMOS transistor N11.

In the seventh PMOS transistor P7, a source is coupled to the node IN2', a drain is connected to a node IN4, and a gate is connected to a node IN3. In the eighth PMOS transistor P8, a source is coupled to the node IN1', a drain is connected to the node IN3, and a gate is connected to the node IN4.

In the tenth NMOS transistor N10, a source is coupled to the ground voltage GND, a drain is connected to the node IN4, and a gate is connected to the clock input node IN1. In the eleventh NMOS transistor N11, a source is coupled to the ground voltage GND, a drain is connected to the node IN3, and a gate is connected to the complementary clock input node IN2.

The second Dickson charge pump 500 includes a seventh MOS transistor N7, an eighth NMOS transistor N8, a fifth PMOS transistor P5, a sixth PMOS transistor P6, a ninth flying capacitor C9, and a tenth flying capacitor C10.

In the seventh MOS transistor N7, a drain is coupled to the node IN1', a source is connected to the node IN4', and a gate is connected to the node IN3'. In the eighth NMOS transistor N8, a drain is coupled to the node IN2', a source is connected to the node IN3', and a gate is connected to the node IN4'.

In the fifth PMOS transistor P5, a source is coupled to the node IN4', a drain is connected to an output terminal Vout, and a gate is connected to the node IN3'. In the sixth PMOS transistor P6, a source is coupled to the node IN3', a drain is connected to the output terminal Vout, and a gate is connected to the node IN4'.

The ninth flying capacitor C9 is connected between the node IN4' and the node IN4. The tenth flying capacitor C10 is connected between the node IN3' and the node IN3.

FIG. 8 a diagram showing waveforms at each node of the high-voltage CMOS charge pump shown in FIG. 7. Hereinafter, operations of the high-voltage CMOS charge pump of the present invention will be described referring to FIG. 8.

When a voltage level of the clock input node IN1 is VDD and a voltage level of the complementary clock input node IN2 is GND, a voltage level of the node IN1' is raised to 2VDD due to a bootstrapping phenomenon. Then, the sixth NMOS transistor N6 is turn-on, charges the eighth flying capacitor C8, and thus a voltage level of the node IN2' becomes VDD. Meanwhile, the fifth NMOS transistor N5, which is cross-coupled with the sixth NMOS transistor N6, is turn-off and the voltage level of the node IN1' is maintained with 2VDD.

In the level shifter 600, the tenth NMOS transistor N10, whose gate is connected to the clock input node IN1, is turn-on, and thus, a voltage level of the node IN4 in the second Dickson charge pump 500 becomes the ground level GND, and the eighth PMOS transistor P8 is turn-on. Also, the seventh PMOS transistor P7, which is cross-coupled with the eighth PMOS transistor P8, is turn-off.

On the other hand, since the eleventh NMOS transistor N11, whose gate is connected to the complementary clock input node IN2, is turn-off and the eighth PMOS transistor P8 is turn-on, the voltage level 2VDD of the node IN1' is transmitted into the node IN3 of the second Dickson charge pump 500, and the voltage level of the node IN3 becomes 2VDD.

That is, the voltage level 2VDD is supplied into the node IN3, and the ground voltage GND is supplied into the node IN4. When the voltage level of the node IN3 becomes 2VDD, the voltage level of the node IN3' is raised to 4VDD. Then, the seventh NMOS transistor N7 is turn-on, charges the ninth flying capacitor C9 with 2VDD. Meanwhile, the eighth NMOS transistor N8, which is cross-coupled with the seventh NMOS transistor N7, is turn-off and the voltage level of the node IN3' is maintained with 4VDD. Consequently, the sixth PMOS transistor P6, whose gate is connected to the node IN4', is turn-on and the voltage level of the output terminal Vout becomes 4VDD.

When a voltage level of the complementary clock input node IN2 is VDD and a level of the clock input node IN1 is the ground voltage GND, a voltage level of the node IN2' is raised to 2VDD due to a bootstrapping phenomenon. Then, the fifth NMOS transistor N5 is turn-on, charges the seventh flying capacitor C7, and thus a voltage level of the node IN1' becomes VDD. Meanwhile, the sixth NMOS transistor N6, which is cross-coupled with the fifth NMOS transistor N5, is turn-off and the voltage level of the node IN2' is maintained with 2VDD.

In the level shifter 600, the eleventh NMOS transistor N11, whose gate is connected to the complementary clock input node IN2, is turn-on, and thus, a voltage level of the node IN3 in the second Dickson charge pump 500 becomes the GND, and the seventh PMOS transistor P7 is turn-on. Also, the eighth PMOS transistor P8, which is cross-coupled with the seventh PMOS transistor P7, is turn-off.

On the other hand, since the tenth NMOS transistor N10, whose gate is connected to the clock input node IN1, is turn-off and the seventh PMOS transistor P7 is turn-on, the voltage level 2VDD of the node IN2' is transmitted into the node IN4 in the second Dickson charge pump 500, and the voltage level of the node IN4 becomes 2VDD.

That is, the voltage level of 2VDD is supplied into the node IN4, and the ground voltage GND is supplied into the node IN3. When the voltage level of the node IN4 becomes 2VDD, the voltage level of the node IN4' is raised to 4VDD. Then, the eighth NMOS transistor N8 is turn-on, charges the tenth flying capacitor C10 with 2VDD. Meanwhile, the seventh NMOS transistor N7, which is cross-coupled with the eighth NMOS transistor N8, is turn-off and the voltage level of the node IN4' is maintained with 4VDD. Consequently, the fifth PMOS transistor P5, whose gate is connected to the node IN3', is turn-on and the voltage level of the output terminal Vout becomes 4VDD.

As described above, the input clock signal IN1 and the complementary input clock signal IN2, which have reversed phases each other, are periodically supplied into the output terminal Vout, and the output voltage is maintained with 4VDD.

In the high-voltage CMOS charge pump of the present invention, the number of MOS transistors is reduced by 6 from the number of transistors of the conventional CMOS charge pump. In other words, 20 MOS transistors are reduced to 14 MOS transistors, which is 30% reduction in area.

In the above description, a high voltage, i.e., 4VDD, is generated by using two Dickson charge pumps and one level shifter in one embodiment of the present invention. However, the number of stage of the Dickson charge pump and the number of the level shifter are not limited in the present invention.

The present application contains subject matter related to Korean Patent Application No. 2007-0112212, filed in the Korean Intellectual Property Office on Nov. 5, 2007, the entire contents of which are incorporated herein by reference.

While the present invention has been described with respect to certain preferred embodiments, it will be apparent to those skilled in the art that various changes and modifications may be made without departing from the scope of the invention as defined in the following claims.

The invention claimed is:

1. A high-voltage complementary metal-oxide semiconductor (CMOS) charge pump, comprising:
   a first charge pump configured to double a supply voltage based on an input clock signal and a complementary input clock signal which have reversed phases to each other;
   a level shifter configured to double voltage levels of the input clock signal and the complementary input clock signal based on an output signal and a complementary output signal of the first charge pump as power sources, to thereby output a doubled-output clock signal and a doubled-complementary output clock signal; and
   a second charge pump configured to double voltage levels of the output signal and the complementary output signal based on the doubled-output clock signal and the doubled-complementary output clock signal from the level shifter,
   wherein the second charge pump comprises:
      a fifth NMOS transistor, including a drain coupled to an output node a source coupled to a first node, and a gate coupled to a second node;
      a sixth NMOS transistor, including a drain coupled to a complementary output node, a source coupled to the second node, and a gate coupled to the first node;
      a third PMOS transistor, including a source coupled to the first node, a drain coupled to a final output terminal, and a gate coupled to the second node;
      a fourth PMOS transistor, including a source coupled to the second node, a drain coupled to the final output terminal, and a gate coupled to the first node;
      a third flying capacitor connected between the first node and a doubled-clock output node; and
      a fourth flying capacitor connected between the second node and a doubled-complementary clock output node.

2. The high-voltage CMOS charge pump of claim 1, wherein the first charge pump comprises:
   a first NMOS transistor, including a drain coupled to a power supply, a source coupled to the output node, and a gate coupled to the complementary output node;
   a second NMOS transistor including a drain coupled to the power supply, a source coupled to the complementary output node, and a gate coupled to the output node;
   a first flying capacitor connected between the output node and a clock input node; and
   a second flying capacitor connected between the complementary output node and a complementary clock input node.

3. The high-voltage CMOS charge pump of claim 2, wherein the level shifter includes:
   a first PMOS transistor including a source coupled to the complementary output node, a drain coupled to the doubled clock output node, and a gate coupled to the doubled-complementary clock output node;
   a second PMOS transistor including a source coupled to the output node, a drain coupled to the doubled-complementary clock output node, and a gate coupled to the doubled clock output node;
   a third NMOS transistor including a source coupled to a ground terminal GND, a drain coupled to the doubled clock output node, and a gate coupled to the clock input node; and
   a fifth NMOS transistor including a source coupled to the GND, a drain coupled to the doubled-complementary clock output node, and a gate coupled to the complementary clock input node.

4. The high-voltage CMOS charge pump of claim 1, further comprising:
   a first CMOS inverter configured to receive a clock signal and invert the clock signal to the input clock signal; and
   a second CMOS inverter configured to receive the input clock signal and invert the input clock signal to the complementary input clock signal.

5. The high-voltage CMOS charge pump of claim 4, wherein the first charge pump includes:
   a first NMOS transistor including a drain coupled to a power supply, a source coupled to the output node, and a gate coupled to the complementary output node;
   a second NMOS transistor including a drain coupled to the power supply, a source coupled to the complementary output node, and a gate coupled to the output node;

a first flying capacitor connected between the output node and a clock input node; and a second flying capacitor connected between the complementary output node and a complementary clock input node.

6. The high-voltage CMOS charge pump of claim 5, wherein the level shifter includes:

a first PMOS transistor including a source coupled to the complementary output node, a drain coupled to the doubled clock output node, and a gate coupled to the doubled-complementary clock output node;

a second PMOS transistor including a source coupled to the output node, a drain coupled to the doubled-complementary clock output node, and a gate coupled to the doubled clock output node;

a third NMOS transistor including a source coupled to a ground terminal GND, a drain coupled to the doubled clock output node, and a gate coupled to the clock input node; and a fifth NMOS transistor including a source coupled to the GND, a drain coupled to the doubled-complementary clock output node, and a gate coupled to the complementary clock input node.

7. The high-voltage CMOS charge pump of claim 6, wherein the first CMOS inverter includes:

a seventh NMOS transistor, whose drain is connected to the clock input node, source is connected to the GND, and gate is connected to a clock input terminal; and a fifth PMOS transistor, whose source is connected to the power supply, drain is connected to the clock input node, and gate is connected to the clock input terminal 8. The high-voltage CMOS charge pump of claim 7, wherein the second CMOS inverter includes:

an eighth NMOS transistor, whose drain is connected to the complementary clock input node, source is connected to the GND, and gate is connected to the clock input node; and a sixth PMOS transistor, whose source is connected to the power supply, drain is connected to the complementary clock input node, and gate is connected to the clock input node.

\* \* \* \* \*